(12) United States Patent
Long et al.

(10) Patent No.: US 6,417,556 B1
(45) Date of Patent: *Jul. 9, 2002

(54) HIGH K DIELECTRIC DE-COUPLING CAPACITOR EMBEDDED IN BACKEND INTERCONNECT

(75) Inventors: Wei Long, Sunnyvale; Qi Xiang, San Jose, both of CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/496,980

(22) Filed: Feb. 2, 2000

(51) Int. Cl.$^7$ ................................................ H01L 29/00
(52) U.S. Cl. ........................ 257/532; 257/307; 257/308; 257/309
(58) Field of Search ................................ 257/532, 301, 257/302, 303, 306, 307, 308, 309–312, 313; 438/399, 255, 398, 665

(56) References Cited

U.S. PATENT DOCUMENTS

| 4,603,059 A | 7/1986 | Kiyosumi et al. |
| 4,779,164 A | 10/1988 | Menzies et al. |
| 4,882,649 A | 11/1989 | Chen et al. |
| 5,089,875 A * | 2/1992 | Koyama ...................... 357/51 |
| 5,134,539 A | 7/1992 | Tuckerman et al. |
| 5,208,725 A | 5/1993 | Akcasu |
| 5,304,506 A | 4/1994 | Porter et al. |
| 5,583,359 A | 12/1996 | Ng et al. |
| 5,780,930 A * | 7/1998 | Malladi ...................... 257/777 |
| 5,872,697 A | 2/1999 | Christensen et al. |
| 5,933,723 A | 8/1999 | Schuegraf et al. |
| 6,146,939 A * | 11/2000 | Dasgupta ................... 438/251 |

\* cited by examiner

Primary Examiner—Olik Chaudhuri
Assistant Examiner—Nathan W. Ha
(74) Attorney, Agent, or Firm—Foley & Lardner

(57) ABSTRACT

An integrated circuit (IC) including an integral, high k dielectric de-coupling capacitor constructed using a single conductive layer within the IC structure. The IC comprises a substrate, a dielectric layer disposed over the substrate, and a conductive layer disposed over the dielectric layer. The conductive layer includes a first line disposed adjacent to a second line, and a high k dielectric material disposed between the first line and the second line. The capacitor is formed between the first line and the second line separated by the high k dielectric material. The capacitor is connected by coupling the first line to a signal and coupling the second line to a capacitor signal.

19 Claims, 13 Drawing Sheets

HIGH K DIELECTRIC DE-COUPLING CAPACITOR EMBEDDED IN BACKEND INTERCONNECT

CROSS REFERENCE

This patent is related to U.S. application Ser. No. 09/496,508 by Long et. al., entitled "Thin Dielectric Interconnect De-coupling Capacitor"; U.S. application Ser. No. 09/497,015 by Long et. al., entitled "High K Interconnect De-coupling Capacitor With Damascene Process"; U.S. application Ser. No. 09/496,986 by Long et. al., entitled "Interconnect Capacitor"; all of which are filed on an even date herewith and assigned to the assignee of the present invention.

FIELD OF THE INVENTION

The present invention is related to integrated circuit (IC) devices. More particularly, the present invention relates to capacitors formed within IC devices.

BACKGROUND OF THE INVENTION

High speed switching in an IC results in high transient currents that cause variations in operating supply voltage. The variations in operating supply voltage, often referred to as ground bounce, result in undesirable circuit operation. To minimize variations and assure proper circuit operation, de-coupling capacitors are used to filter much of the noise that may be present between operating supplies such as power and ground. As switching speeds and associated transient currents have increased, de-coupling capacitors have become indispensable building blocks in electronic design.

Traditionally, discrete de-coupling capacitors have been provided external to the IC on a printed circuit board (PCB). Placing de-coupling capacitors on the PCB requires long wire connections between the IC and the de-coupling capacitor. Resistance from the long wire connections in combination with de-coupling capacitance creates an excessively long RC time constant. The long time constant limits the ability of the de-coupling capacitor to filter high frequency noise. In addition to limiting de-coupling capacitor effectiveness, providing discrete de-coupling capacitors on the PCB involves increased component, assembly, and design costs.

To avoid problems related to providing de-coupling capacitors on the PCB, de-coupling capacitors have been integrally combined with an IC chip carrier. Providing de-coupling capacitors as part of the IC chip carrier allows the de-coupling capacitors to be physically closer to the IC. Reduced wire connection resistance due to closer physical location allows for higher IC switching speeds by reducing the RC time constant. However, due to increasing IC density and speeds, chip carrier de-coupling capacitors cannot sufficiently reduce or isolate noise on IC chips placed in the carrier.

De-coupling capacitor effectiveness can be increased and component and assembly costs reduced by integrating de-coupling capacitors into an IC. Various methods of fabricating de-coupling capacitors as part of an integrated circuit have been proposed. Fabrication of parallel plate capacitors using two or more metal layers of an integrated circuit separated by an intervening insulating layer has been utilized as a de-coupling capacitor. A multi-layer capacitor where one layer is a power layer has also been utilized as a de-coupling capacitor. While these types of structure provides a reasonable capacitor, a significant amount of two or more metal layers is consumed to build the capacitor plates. Further, it is difficult and costly to control the thickness of the separating dielectric layer thickness. Without expending the cost and effort required to tightly control of the separating dielectric layer thickness, reliability and yield are negatively impacted. In addition, design rules and design efforts are complicated as multiple layers of the IC design are impacted.

Alternatively, a de-coupling capacitor can consist of two sets of parallel conducting strips formed from distinct metal layers and separated by an insulating layer. Similar to the above-discussed parallel plate technique this technique consumes considerable area of two or more metal layers to realize a capacitor. Area consumed realizing capacitors could otherwise be used for signal or logic wiring. In addition, this technique impacts multiple layers of the IC and the cost and effort required to control insulating layer thickness must be born.

A large area thin gate oxide capacitor can be used to realize de-coupling capacitance. While this type of de-coupling capacitor is useful, it has a number of drawbacks. First, as thin gate oxide capacitors require a large active area, a large die area is consumed to realize a de-coupling capacitor (as much as 20–50% of die area). Next, these large area capacitors are prone to stress failure, thereby limiting yield and/or reliability. For example, if the oxide layer is not as thick as desired, a stress point may develop and, with time, cause the chip to fail. Alternatively, the chip may fail immediately where the oxide layer has a thin hole or other defect. Finally, large semiconductor resistance may result in considerable RC time constant. Similar to mounting de-coupling capacitors on a PCB, increasing the RC time constant reduces the high frequency response of a realized capacitor. Thus, these de-coupling capacitors are expensive, prone to failure and of limited effectiveness.

Thus, there is a need for a reliable, cost effective, high frequency, and high yield IC capacitor. The present invention addresses this need as well as other needs.

SUMMARY OF THE INVENTION

One embodiment relates to an integrated circuit comprising a substrate, a dielectric layer disposed over the substrate, and a conductive layer disposed over the dielectric layer. The conductive layer includes a first line disposed adjacent to a second line with an intervening space between the first and second lines. A dielectric material is disposed in the intervening space between the first and the second lines such that a capacitor is formed. The formed capacitor is connected by coupling the first line to a signal and coupling the record line to a capacitor signal.

Another embodiment relates to a metal layer for an IC. The metal layer comprises: (1) a first conductive line coupled to a signal, and (2) a second conductive line coupled to a capacitor signal. Together the first and second conductive lines form a de-coupling capacitor above the dielectric layer and within the metal layer.

Yet another embodiment relates to a method Of manufacturing an integrated circuit including an internal de-coupling capacitor. The method comprises: (1) providing an electrical device upon a substrate; (2) providing an insulative layer over the electrical device and the substrate; and (3) providing a conductive layer over the insulative layer. The conductive layer includes a first conductive line coupled to the electrical device and a second conductive line coupled to a capacitor signal node. Together the first and second conductive lines form a de-coupling capacitor above the dielectric layer.

BRIEF DESCRIPTION OF THE DRAWINGS

The present invention will become more fully understood from the following detailed description, taken in conjunction with the accompanying drawings, wherein like reference numerals refer to like parts, in which.

DETAILED DESCRIPTION OF THE PREFERRED EMBODIMENTS

Figure 1:
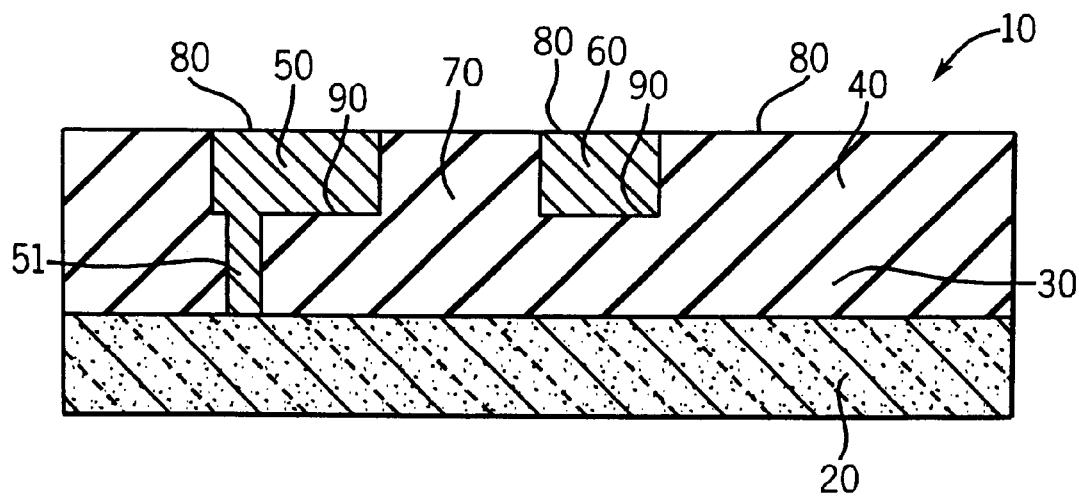
FIG. 1 is a cross-sectional view of a portion of an IC including conductive elements separated by a dielectric to form a capacitor.
Figure 2:
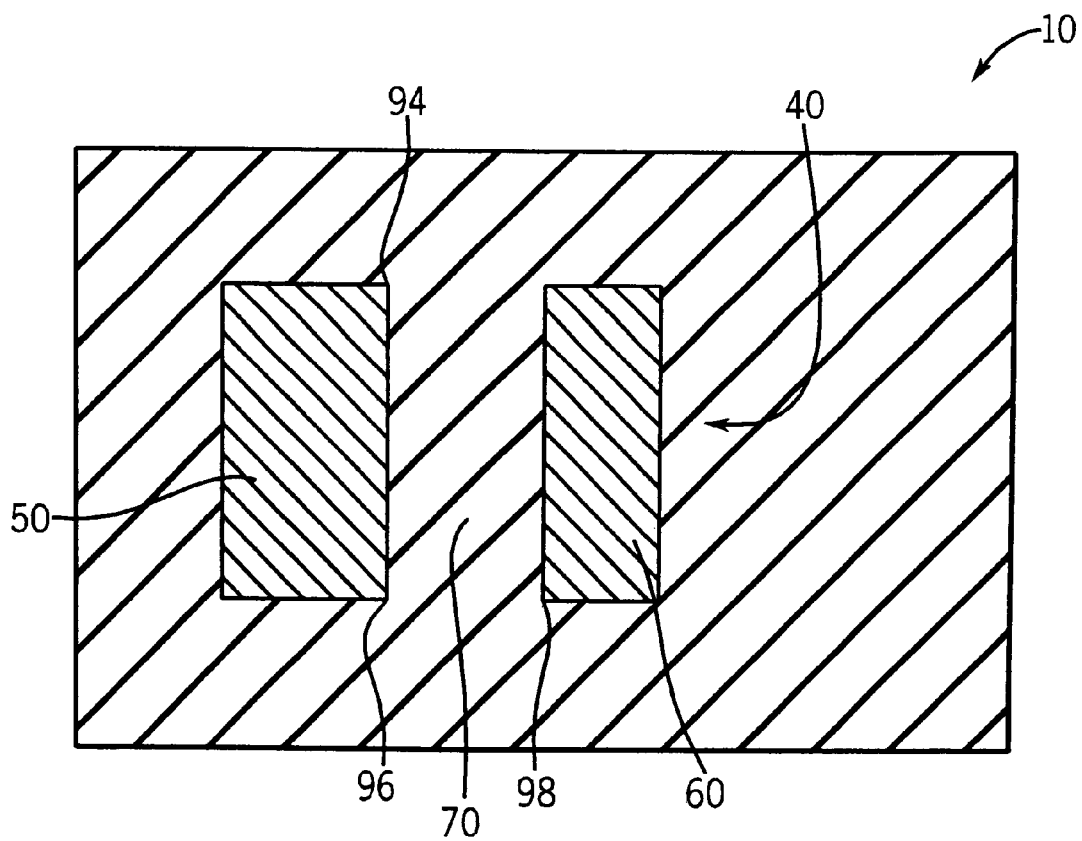
FIG. 2 is a top view of the IC illustrated in FIG. 1 showing the conductive elements separated by the dielectric to form a capacitor.
Figure 3:
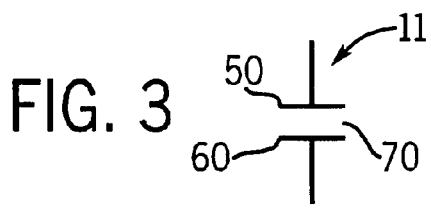
FIG. 3 is an electrical schematic diagram of the capacitor illustrated in FIGS. 1 and 2.

FIGS. 1 through 3 illustrate an interconnect capacitor in accordance with exemplary embodiments. Referring to FIG. 1, a cross-sectional view of a portion 10 of an integrated circuit (IC) is illustrated to show an interconnect capacitor formed within the IC. Portion 10 includes a substrate 20, a dielectric layer 30 disposed over the substrate 20, and a conductive layer 40 disposed over the dielectric layer 30. Conductive layer 40 comprises all material disposed between an intermediate level 90 and the top level 80 of the portion 10. Particularly, conductive layer 40 includes a conductive line 50 and a conductive line 60 separated by a dielectric material 70. The interconnect capacitor is formed by using dielectric material 70 to separate conductive line 50 coupled to a signal, from conductive line 60 coupled to a capacitor signal. Thus, an interconnect capacitor is formed at a single IC level.

While FIG. 1 and the preceding discussion describe the interconnect capacitor formed in the conductive layer 40 closest to the substrate 20, it should be noted that the interconnect capacitor can be formed in any conductive layer within the IC. Preferably, layer 40 is a metal layer which can be coupled to substrate 20 by a via 51. Conductive line 50 can be a signal line which carries a signal for use off-chip. Line 60 can be a capacitor signal line which carries a fixed voltage (e.g., ground, VCC, etc.).

Referring now to FIG. 2, a top view of the portion 10 is illustrated. As noted in the discussion of FIG. 1, conductive line 50 is separated from conductive line 60 by a dielectric material 70 to form the interconnect capacitor. Next, FIG. 3 relates conductive line 50, conductive line 60, and dielectric material 70 of FIGS. 1 and 2 to the respective elements of a capacitor schematic 11.

Conductive line 50 and conductive line 60 are formed from conductive materials, such as, refractory metals or other conductive matter (e.g., Aluminum (Al), Copper (Cu), Titanium (Ti)). However, it should be noted that any conductive material can be used, including any combination of metals or alloys, to form line 50 and line 60. In addition, it should be noted that the horizontal width (as shown in FIG. 1) of conductive line 50 may be the same or different from the horizontal width of conductive line 60. Conductive lines 50 and 60 are preferably composites or stacks of various metals, alloys and compounds.

Dielectric material 70 can be comprised of any dielectric material known in the art including complicated dielectric layers comprised of combinations of dielectric materials. Dielectrics known to be particularly useful include: (1) amorphous or crystalline $Ta_2O_5$, and (2) anatase, amorphous, or crystalline $SiO_2$, $TiO_2$, $Al_2O_3$, $Si_3N_4$, BST, or PZT. A high k dielectric is any dielectric with a dielectric constant, k, greater than 4.1. The following table provides the k value for the listed dielectrics:

| Dielectric | $SiO_2$ | $Ta_2O_5$ (amorph.) | $Ta_2O_5$ (crys) | $TiO_2$ (crys., anatase) | $TiO_2$ (amorph.) | $Al_2O_3$ | $Si_3N_4$ | BST | PZT |
|---|---|---|---|---|---|---|---|---|---|
| k | 3.9 | ~26 | ~80 | ~30 | ~120 | ~10 | 7.8 | 200–300 | ~1200 |

Estimated capacitance for a parallel area capacitor as illustrated in FIGS. 1 through 3 is determined according to the following equation: C=k*Area /Distance. More accurate capacitance values can be determined utilizing simulation tools, such as, Raphael developed Avanti. Therefore, the amount of capacitance achievable by an interconnect capacitor is primarily a function of a common area of conductive lines 50 and 60 (Area), the distance separating conductive lines 50 and 60 (Distance), and a dielectric constant, k, of dielectric material 70. For example, equation parameters used to determine the capacitance of the interconnect capacitor illustrated in FIGS. 1 through 3 are: (k) the k value for dielectric material 70, (Area) a linear distance from a capacitor end 94 to a capacitor end 96 multiplied by a linear distance from intermediate level 90 to top level 80 of the portion 10, and (Distance) the Distance from capacitor end 96 to a capacitor end 98. It should be noted that any of the equation parameters (k, Area, or Distance) can be varied to create a wide array of interconnect capacitors without departing from the scope of the present invention.

While the distance between conductive lines 50 and 60 can be varied, the minimum line spacing (lithographic capability) of a chosen technology dictates the minimum distance from capacitor end 96 to capacitor end 98. As improved technologies are developed that minimize the achievable line spacing (e.g., horizontal shrink), greater unit length capacitance is achievable according to the previously provided parallel area capacitor equation. Thus, as technology improves, the present invention can achieve greater capacitance given the same remaining parameters (e.g., the principles of the present invention become even more valuable). As horizontal shrink is more significant than vertical shrink in improved technologies, the present invention, by creating an interconnect capacitor in a single layer, offers significant advantages over technologies relying on multi-layer capacitors.

As an example of achievable capacitors, in a typical 0.25 um technology, interconnect capacitance of 0.10–0.15 $fF/um^2$ is possible on a first metal layer which is 0.6 microns thick and includes silicon dioxide as a dielectric material and 0.07–0.16 $fF/um^2$ on metal layer 11 (e.g., Aluminum) which is 0.6 microns thick and includes silicon dioxide as a dielectric. Thus, a 1 pF interconnect capacitor can be realized using metal layers I or II where the conductive line 50 and the conductive line 60 are less than 10 mm in length. Alternatively, in the same 0.25 um technology, a capacitor as large as 1 nF could be created in a 4 mm by 4 mm area of a fourth metal layer.

The present invention is flexible such that a capacitor of any shape allowed by the design rules of a chosen technology can be realized. The following embodiments of the present invention demonstrate the flexibility achievable by varying the shape of the conductive lines and separating dielectric.

Figure 4:
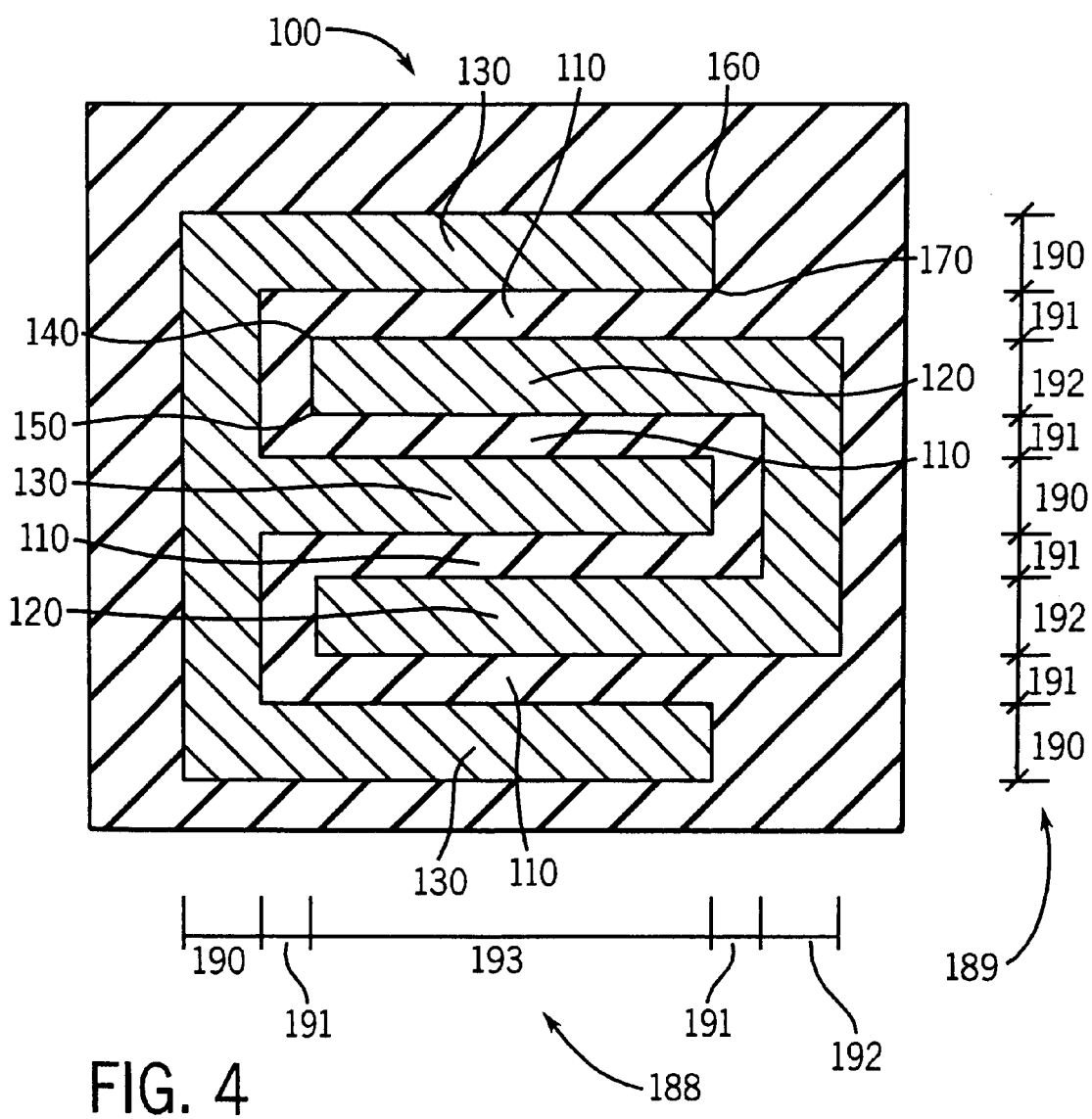
FIG. 4 is a top view a portion of an integrated circuit including two conductive elements interstitially placed and separated by a dielectric to form a capacitor.

FIG. 4 provides a top view of a portion 100 of an integrated circuit including an interstitial capacitor used as an interconnect or de-coupling capacitor. The interstitial capacitor is formed by a conductive line 120 formed in a "U" shape and a conductive line 130 formed in a "E" shape. Conductive line 120 and conductive line 130 are separated by a dielectric material 110. The interstitial capacitor of the portion 100 has the following dimensions shown on horizontal line 188, and vertical line 189 for the purpose of illustration: (1) a distance 190 which is the linear distance from a capacitor end 160 to a capacitor end 170, (2) a distance 191 which is the vertical linear distance from capacitor end 170 to a capacitor end 140, (3) a distance 192 which is the linear distance from the capacitor end 140 to a capacitor end 150, and (4) a distance 193 which is the horizontal linear distance from the capacitor end 140 to the capacitor end 170.

To determine the estimated capacitance of the interstitial capacitor of the portion 100, the following parameters of the previously provided parallel area capacitor equation, C=k*Area/Distance, are used:

(1) k=the k value for dielectric material 110,
(2) Area=a common length of conductive line 120 and second conductive line 130 multiplied by a depth of conductive lines 120 and 130 where:
   The common length of conductive line 120 and conductive line 130 is distance 190, plus distance 192 multiplied by two, plus distance 193 multiplied by four. In the case where distance 193 is considerably larger than distances 190 and 192, the common length may be approximated as distance 193 multiplied by four.
   The depth of conductive lines 120 and 130 is the linear distance (not shown in FIG. 4, but aptly illustrated by FIG. 1) from intermediate level 90 to the top level 80 of the portion 10 of FIG. 1.
(3) Distance=distance 191.

Thus, as an example, a 0.3 pF interconnect capacitor can be realized in a minimum area of approximately 4000 $um^2$ in a fourth metal layer of a typical 0.25 um technology where the dielectric constant, k, is between 3.9–4.1, distance 190 is 0.8 microns distance 191 is 0.8 microns, distance 192 is 0.8 microns, and distance 193 is 625 microns.

It should be noted that the parallel area capacitor equation does not account for capacitance in the corner areas between conductive line 120 and conductive line 130. However, one skilled in the art should recognize that the amount of capacitance resulting in the corner areas is insignificant relative to the amount of capacitance of non-corner areas between conductive line 120 and conductive line 130. If required, a capacitance value accounting for the corner areas can be calculated.

Figure 5:
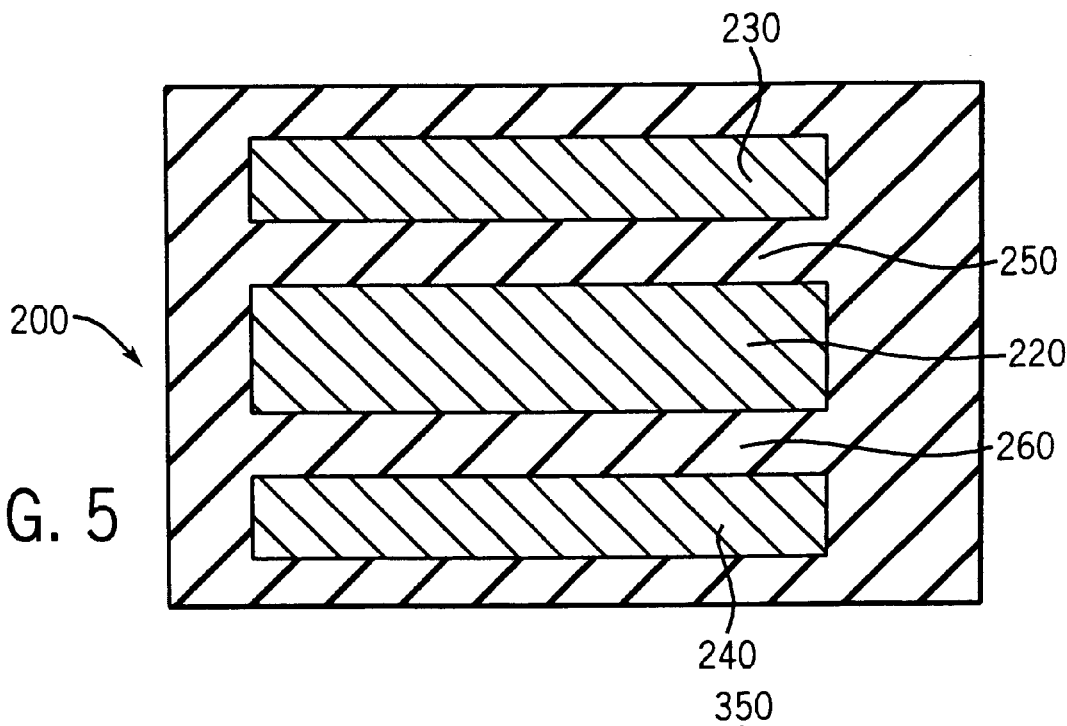
FIG. 5 is a top view of a portion of an integrated circuit including a capacitor formed by placing conductive lines along the edge of a signal line.

Referring now to FIG. 5, another exemplary embodiment is illustrated. In FIG. 5, a portion 200 of an IC is illustrated. The portion 200 includes a signal line 220 parallel to a capacitance line 230 separated by a dielectric material 250, and a capacitance line 240 separated by a dielectric material 260. It should be noted that if capacitance line 240 is removed, the interconnect capacitor included in portion 200 would be similar to the interconnect capacitor included in portion 10 of FIGS. 1 and 2. Combining the elements of the portion 200, two interconnect capacitors are realized: (1) an interconnect capacitor comprising signal line 220, capacitance line 230, and dielectric material 250, and (2) an interconnect capacitor comprising signal line 220, capacitance line 240, and dielectric material 260. Thus, FIG. 5 illustrates a two-fold increase in capacitance achievable by adding capacitance line 240. This increase in estimated capacitance is verified using the parallel area capacitance equation, $C=k*Area/Distance$, where: (1) a distance between second capacitance line 240 and signal line 220 is the same as a distance between capacitance line 230 and signal line 220, (2) dielectric material 260 is composed of the same material as dielectric material 250, and (3) a surface area of capacitance line 230 is the same as a surface area of capacitance line 240.

Figure 6:
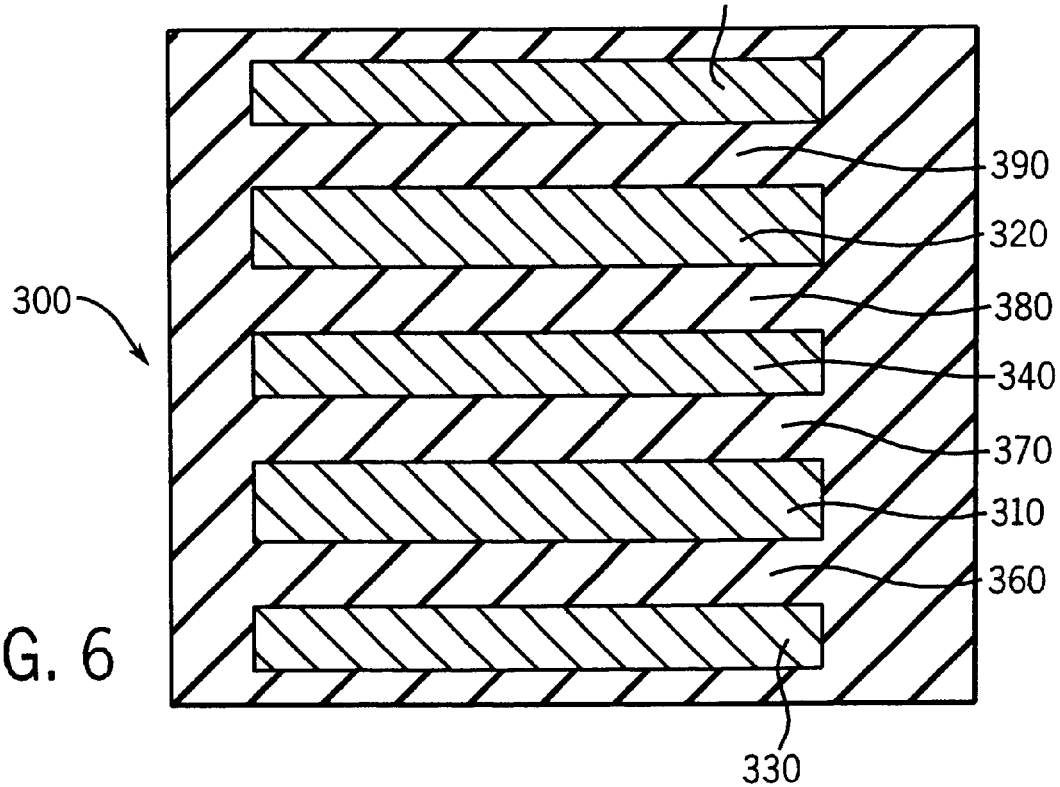
FIG. 6 is a top view of a portion of an integrated circuit including a capacitor formed by placing conductive lines along the edge of a metal signal line which has been split to allow additional conductive lines.

Referring now to FIG. 6, yet another exemplary embodiment is illustrated. In FIG. 6, portion 300 of an IC is illustrated. The portion 300 includes a signal line 310, a signal line 320, a capacitance line 330, a capacitance line 340, a capacitance line 350, a dielectric material 360, a dielectric material 370, a dielectric material 380, and a dielectric material 390. Combining the elements of the portion 300, four interconnect capacitors around signal lines 310 and 320 are realized: (1) an interconnect capacitor comprising signal line 310, capacitance line 330, and dielectric material 360, (2) an interconnect capacitor comprising signal line 310, capacitance line 340, and dielectric material 370, (3) an interconnect capacitor comprising signal line 320, capacitance line 340, and dielectric material 380, and (4) an interconnect capacitor comprising signal line 320, capacitance line 350, and dielectric material 390. The capacitor of the portion 300 results in a four-fold increase in interconnect capacitance over the capacitor demonstrated in portion 10 of FIGS. 1 and 2 where: (1) surface area of signal lines 310 and 320 are equal, (2) surface area of capacitance lines 330, 340 and 350 are equal, and (3) dielectric materials 360, 370, 380 and 390 are the same material.

In a useful manifestation of the capacitor of the portion 300 a wide original signal line is split to form signal line 310 and signal line 320. Signal lines 310 and 320 are both connected to the same signal source. Thus, a two-fold increase in capacitance over the capacitor demonstrated in portion 200 of FIG. 5 can be realized by dividing a wide signal line into two narrower signal lines. It should be recognized that a wide signal line could be divided into several narrower signal lines with interspersed capacitance lines to produce even larger interconnect capacitors.

FIGS. 7 through 12 illustrate an alternative embodiment of the present invention. Similar to the embodiment illustrated in IC FIGS. 1 through 6, the alternative embodiment demonstrates formation of interconnect capacitors at the same level of an IC. Unlike FIGS. 1 through 6, the alternative embodiment utilizes a thin dielectric formed using an alternative method discussed below.

Figure 7:
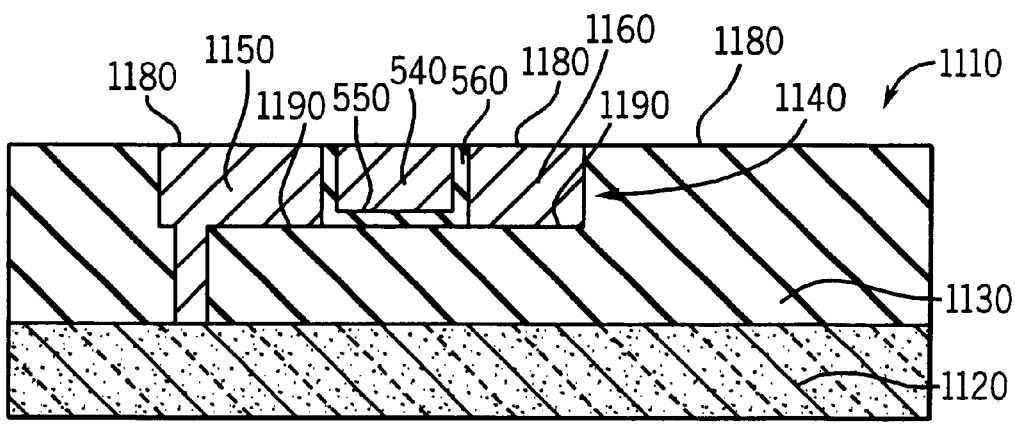
FIG. 7 is a cross-sectional view of a portion of an IC including a conductive layer having three conductive lines separated by the dielectric material.

Turning now to FIG. 7, a cross-sectional view of a portion 1110 of an IC is illustrated to show an interconnect capacitor formed within the IC. Portion 1110 includes a substrate 1120, a dielectric layer 1130 disposed over the substrate 1120, and a conductive layer 1140 disposed over the dielectric layer 1130. Conductive layer 1140 comprises all material disposed between an intermediate level 1190 and the top level 1180 of the portion 1110. Particularly, conductive layer 1140 includes a conductive line 1150 and a conductive line 1160 separated by a capacitive line 540. The capacitive line 540 is separated from conductive lines 1150 and 1160 by a dielectric material 560. In this configuration, a first and a second interconnect capacitor are formed. The first interconnect capacitor is formed by using dielectric material 560 to separate conductive line 1150 coupled to a signal, from capacitive line 540 coupled to a capacitor signal. The second interconnect capacitor is formed by using dielectric material 560 to separate conductive line 1160 coupled to a signal, from capacitive line 540 coupled to a capacitor signal.

Similar to the exemplary embodiment illustrated in FIGS. 1 through 6, it should be noted that the interconnect capacitors can be formed in any conductive layer within the IC. Distinct from the exemplary embodiment illustrated in FIGS. 1 through 6, capacitive line 540 does not extend to the bottom 1190 of the conductive layer 1140. Instead, capacitive line 540 extends only to intermediate level 550. Alternatively, line 540 could be fabricated with dielectric sidewalls and extend to intermediate level 550.

Figure 8:
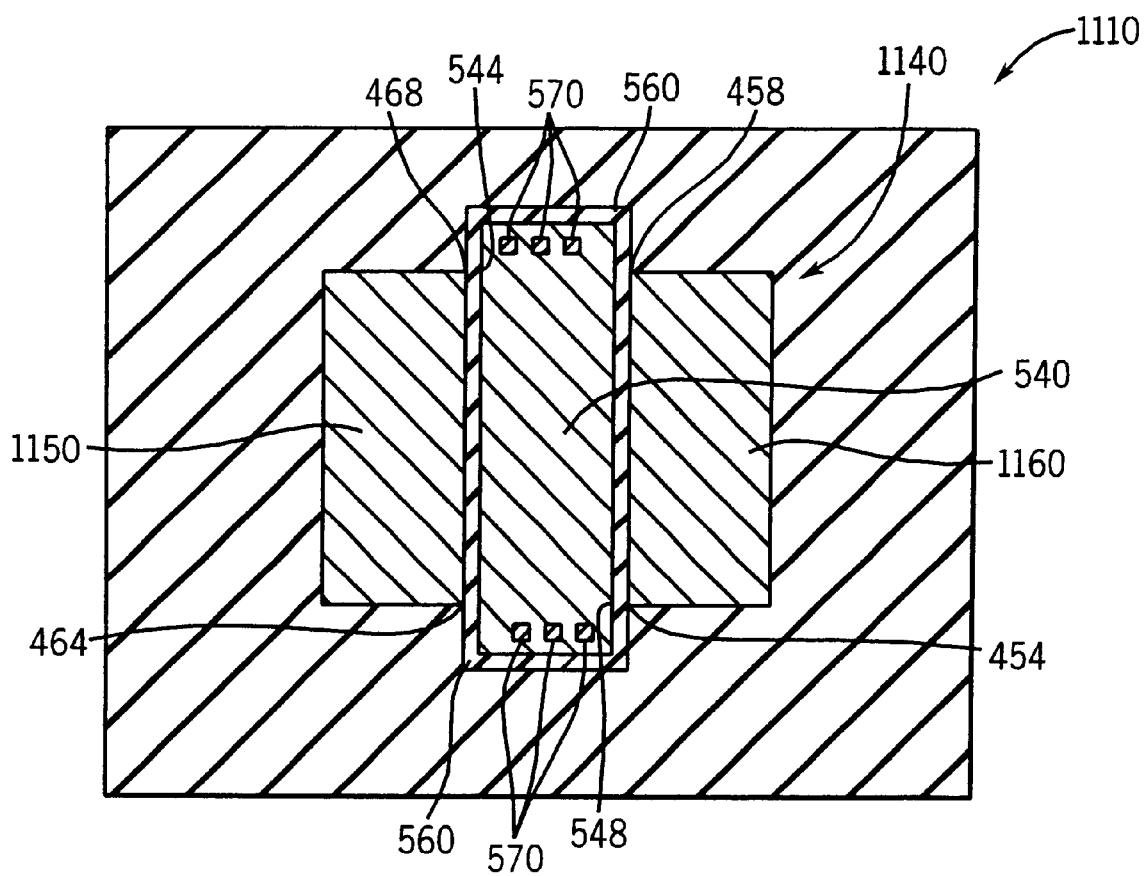
FIG. 8 is a top view of the IC illustrated in FIG. 7 showing the three conductive lines separated by the dielectric to form a pair of capacitors.

Referring now to FIG. 8, a top view of the portion 1110 is illustrated. As noted in the discussion of FIG. 7, conductive line 1150 is separated from capacitive line 540 by dielectric material 560 thus forming the first interconnect capacitor. The second interconnect capacitor is formed by separating conductive line 1160 from capacitive line 540 by dielectric material 560. Additionally, FIG. 8 illustrates inter-level contacts on interconnects 570. It should be noted that inter-level interconnects could be used to connect conductive line 1150, conductive line 1160, and/or capacitive line 540 to structures at different levels of the IC. Further, it should be noted that dielectric material 560 surrounds capacitive line 540.

Figure 9:
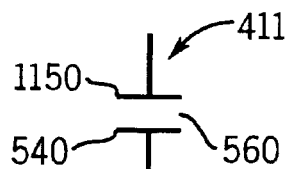
FIGS. 9–9A are electrical schematic diagrams of the capacitors illustrated in FIGS. 7 and 8.
Figure 9A:
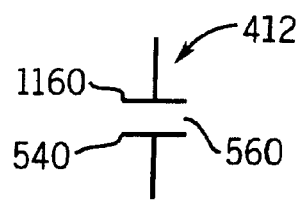

Next, FIG. 9 relates the first interconnect capacitor comprising conductive line 1150, capacitive line 540, and dielectric material 560 to the respective elements of a capacitor schematic 411. In addition, the second interconnect capacitor comprising conductive line 1160, capacitive line 540, and dielectric material 560 is related to the respective elements of a capacitor schematic 412.

Conductive line 1150, conductive line 1160, and capacitive line 540 are formed from conductive materials, such as, refractory metals or other conductive matter (e.g., Aluminum (Al), Copper (Cu), Titanium (Ti)). However, it should be noted that any conductive material can be used, including any combination of metals, to form the conductive lines 1150 and 1160 as well as capacitive line 540. In addition, it should be noted that the horizontal width (as shown in FIG. 7) of conductive line 1150, conductive line 1160, and/or capacitive line 540 may be varied to meet design needs.

Similar to the previously described exemplary embodiment, dielectric material 560 can be comprised of any dielectric material known in the art including complicated dielectric layers comprised of combinations of dielectric materials. Dielectrics known to be particularly useful include those listed in relation to the exemplary embodiment.

Estimated capacitance for the alternative embodiment may be calculated using the equation for capacitance for a parallel area capacitor, C=k*Area/Distance. For example, equation parameters used to determine the capacitance of the first interconnect capacitor illustrated in FIGS. 7 through 9 are: (k) the k value for the dielectric 560, (Area) a linear distance from a capacitor end 468 to a capacitor end 464 multiplied by a linear distance from an intermediate level 550 (see FIG. 7) to the top level 1180 of the portion 1110, and (Distance) the Distance from the capacitor end 544 to a capacitor end 468. Analogous to the first interconnect capacitor, the second interconnect capacitor uses the following variables in the capacitance equation: (k) the k value for the dielectric 560, (Area) a linear distance from a capacitor end 458 to a capacitor end 454 multiplied by a linear distance from an intermediate level 550 (see FIG. 7) to the top level 1180 of the portion 1110, and (Distance) the Distance from the capacitor end 454 to a capacitor end 548. It should be noted that any of the equation parameters can be varied to create a wide array of interconnect capacitors without departing from the scope of the present invention.

As an example of achievable capacitors, in a typical 0.25 um technology interconnect capacitance of $0.70-300$ fF/$um^2$ is possible using previously listed dielectrics and where the conductive layer 1140 is 0.59 microns thick (distance from intermediate level 550 to top level 1180), and the dielectric 560 is 100 nm in thickness (distance from capacitor end 468 to capacitor end 544). Advantageously, these capacitances are in general greater than achievable gate capacitance (approximately 8 fF/$um^2$). Optimizing the process technology and reducing the thickness of dielectric material 560 could further increase these capacitances.

Similar to the embodiment illustrated in FIGS. 1 through 6, the alternative embodiment is flexible such that a capacitor of any shape allowed by the design rules of a chosen technology can be realized. The following examples demonstrate the flexibility achievable by varying the shape of the conductive lines and separating dielectric.

Figure 10:
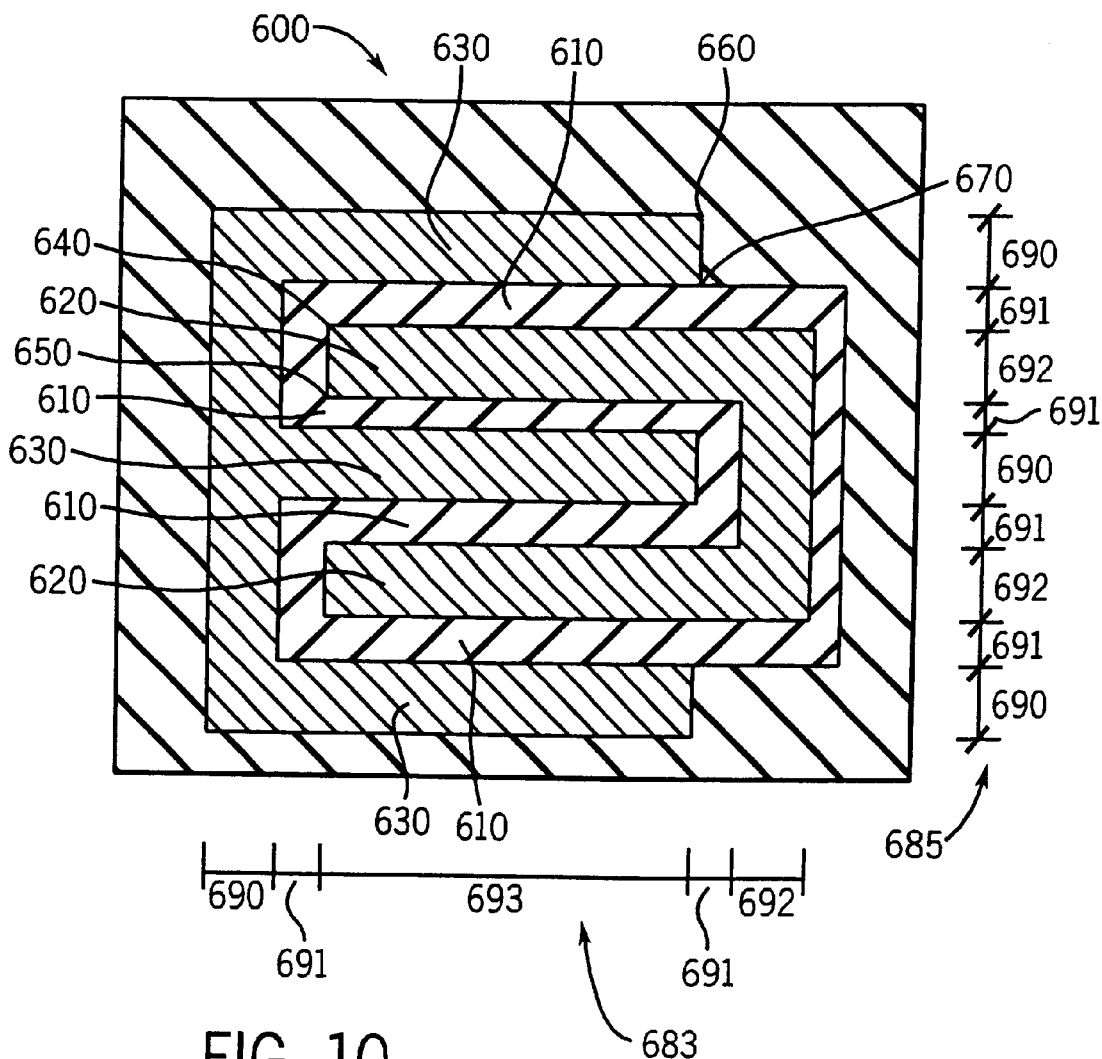
FIG. 10 is a top view of a portion of an IC including two conductive elements interstitially placed and separated by a dielectric to form a capacitor.

FIG. 10 provides a top view of a portion 600 of an integrated circuit including an interstitial capacitor. The interstitial capacitor is formed by a conductive line 620 formed in a "U" shape and a conductive line 630 formed in a "W" shape. Analysis of the capacitor illustrated in FIG. 10 follows the analysis presented in relation to FIG. 4. The only difference between the two analysis is that the depth of conductive line 620 is multiplied by a common length of conductive line 620 and conductive line 630 to calculate the Area variable. In the alternative embodiment, the depth of conductive line 620 is the linear distance between intermediate level 550 and the top level 1180 of the portion 1110 as shown in FIG. 7. Horizontal line 683 and vertical line 685 are shown only to facilitate the description of the capacitor illustrated in FIG. 10.

Figure 11:
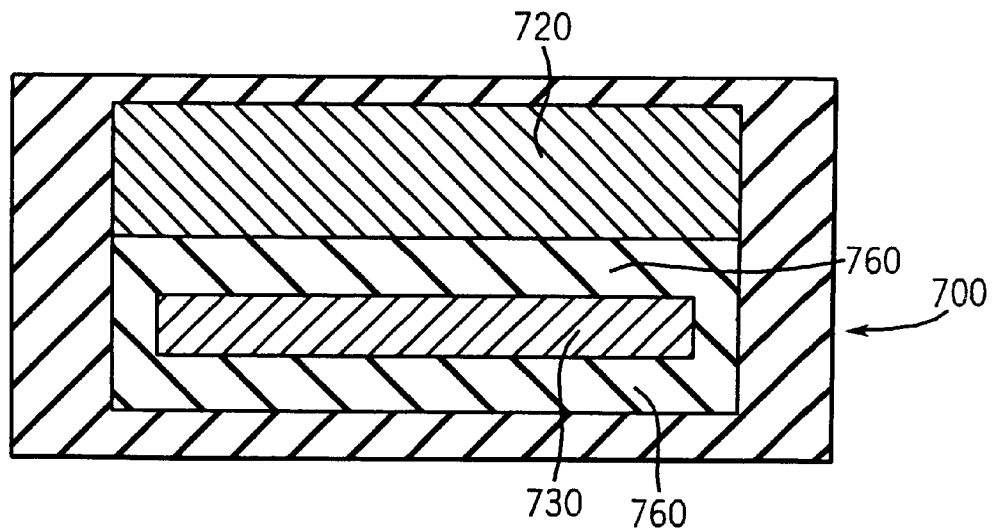
FIG. 11 is a top view of a portion of an IC similar to the IC illustrated in FIG. 7, but having a capacitor having two conductive lines.

Referring now to FIG. 11, another example of an interconnect capacitor is illustrated in a portion 700. The portion 700 includes a signal line 720 parallel to a capacitance line 730 separated by a dielectric material 760. It should be noted that the portion 700 illustrated in FIG. 11 would be equivalent to the portion 1110 of FIG. 8 if one of the conductive lines (1150 or 1160 of FIG. 8) was removed. Thus, analysis of the portion 700 follows analysis of the portion 1110 of FIG. 8 where only a single interconnect capacitor is realized.

Figure 12:
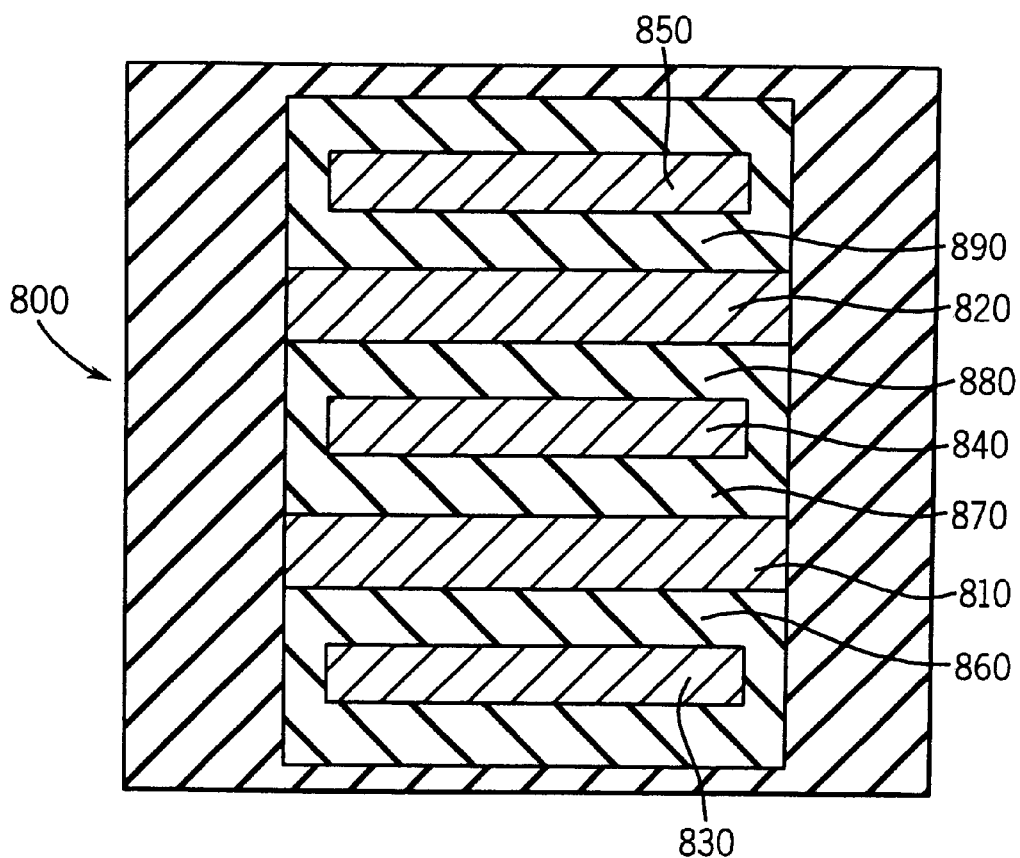
FIG. 12 is a top view of a portion of an IC having a capacitor formed by placing conductive lines along the edge of a metal signal line which has been split to allow additional conductive lines.

Referring now to FIG. 12, another alternative embodiment is presented. In FIG. 12, a portion 800 of an IC is illustrated. The portion 800 includes a signal line 810, a signal line 820, a capacitance line 830, a capacitance line 840, a capacitance line 850, a dielectric material 860, a dielectric material 870, a dielectric material 880, and a dielectric material 890. Similar to the discussion of FIG. 6, combination of the elements of the portion 800 result in four interconnect capacitors. Thus, the capacitor of the portion 800 results in a four-fold increase in interconnect capacitance over the capacitor demonstrated in portion 700 of FIG. 11 where: (1) surface area of signal lines 810 and 820 are equal, (2) surface area of capacitance lines 830, 840 and 850 are equal, and (3) the dielectric materials 860, 870, 880 and 890 are the same material.

The embodiments of the capacitors discussed with reference to FIGS. 1–12 can be fabricated using methods illustrated in FIGS. 13 through 31. FIGS. 13 through 17 illustrate a method of fabricating interconnect capacitors on a single layer of an IC. The method uses a high k dielectric between neighboring interconnect lines at the same IC level to realize the capacitor. Explicitly, narrow gaps between interconnect lines are filled by a high k dielectric while wider gaps are filled with an alternate dielectric. While a high k dielectric material increases capacitance, the method demonstrated in FIGS. 13 through 17 is equally applicable to capacitors having either a high k value dielectric or a dielectric with a low k value.

Figure 13:
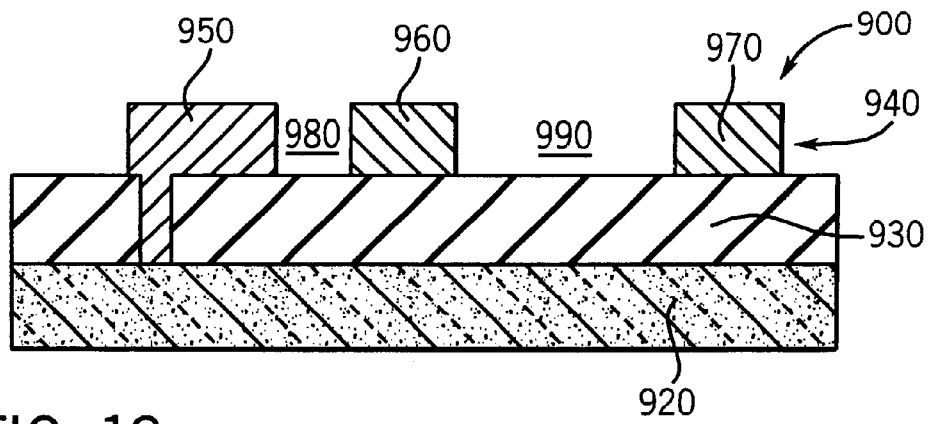
FIG. 13 is a cross-sectional view of a portion of a conductive layer having three conductive lines.

Referring to FIG. 13, a portion 900 of an IC is illustrated. Portion 900 includes a substrate 920, a dielectric layer 930 disposed over substrate 920, and a conductive layer 940 disposed over the dielectric layer 930. Conductive layer 940 is comprised of a conductive line 950, a conductive line 960, and a conductive line 970. Conductive lines 950, 960, and 970 are preferably created by etching a metal layer according to a lithographic pattern. Conductive lines 950 and 960 are separated by an aperture 980 and conductive lines 960 and 970 are separated by an aperture 990. Preferably, aperture 980 has the width of a minimum lithographic feature. Aperture 990 is larger than aperture 980 as such, the spacing between the first and second signal lines 960 and 970 is greater than the spacings between the first signal line 960 and the capacitive line 950.

Figure 14:
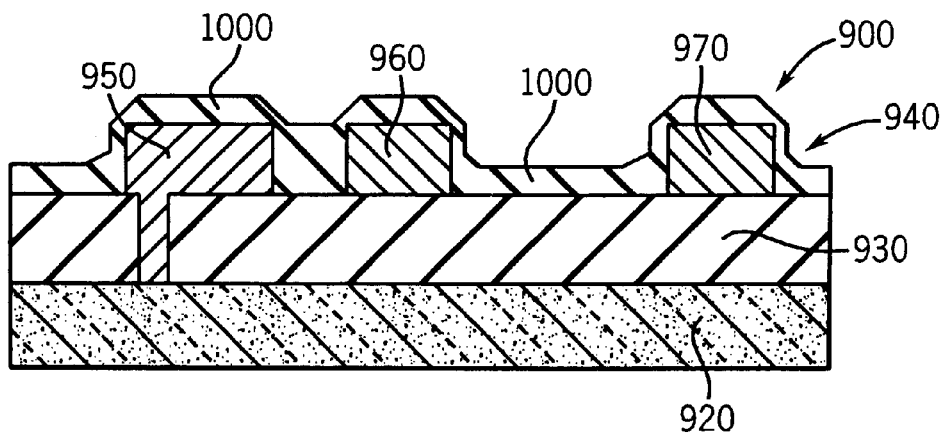
FIG. 14 is a cross-sectional view of the portion of the IC of FIG. 13 showing a selective a thin dielectric layer deposition step.

Turning now to FIG. 14, a thin dielectric material 1000 is formed over conductive layer 940. Preferably, thin dielectric material 1000 is formed by conformal chemical vapor deposition (CVD). The thickness of dielectric material 1000 is chosen such that narrow aperture 980 (FIG. 13) is filled with dielectric material 1000. Thin dielectric material 1000 is formed to a thickness greater than one half of a horizontal distance between conductive lines 950 and 960. This deposition thickness is required to assure the aperture 980 (FIG. 13) is filled with the thin dielectric material 1000.

Figure 15:
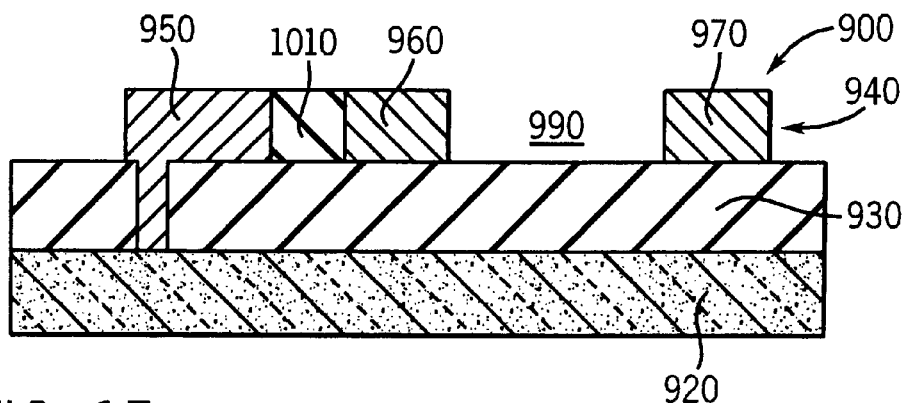
FIG. 15 is a cross-sectional view of the portion of the IC of FIG. 13, showing a selective removal of the thin dielectric layer step.

Turning now to FIG. 15, after formation of thin dielectric material 1000 over conductive layer 940, thin dielectric material 1000 is selectively removed. In the removal process, all of thin dielectric material 1000 is removed except for a remaining portion between conductive lines 950 and 960. Material 1000 can be selectively removed by dry etching. After removal, a chemical-mechanism polish (CMP) can planarize material 1010. Thin dielectric material 1000 between lines 950 and 960 comprises the thin dielectric 1010 of an interconnect capacitor.

Preferably, thin dielectric material 1000 is removed by using an isotropic etch. However, any method capable of removing thin dielectric material 1000 while leaving the thin dielectric 1010 can be used. At this point, an interconnect capacitor, comprising conductive line 950 and conductive line 960 separated by thin dielectric 1010, is realized.

Figure 16:
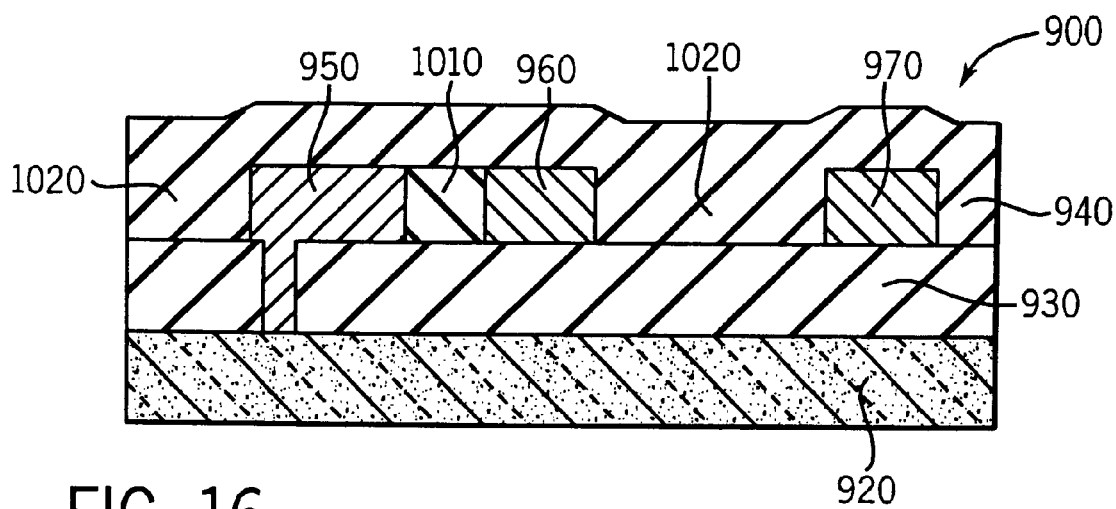
FIG. 16 is a cross-sectional view of the portion of the IC of FIG. 13 showing a dielectric material deposition step.

Turning now to FIG. 16, with the interconnect capacitor formed, conductive layer 940 is completed. A thick dielectric material 1020 is formed over conductive layer 940. Thick dielectric material 1020 is preferably the same material used to comprise dielectric layer 930. Further, thick dielectric material 1020 is preferably formed by deposition, but any method of forming thick dielectric 1020 can be used. Thus, a capacitor similar to the capacitors described with reference to FIGS. 1–6 is formed.

Figure 17:
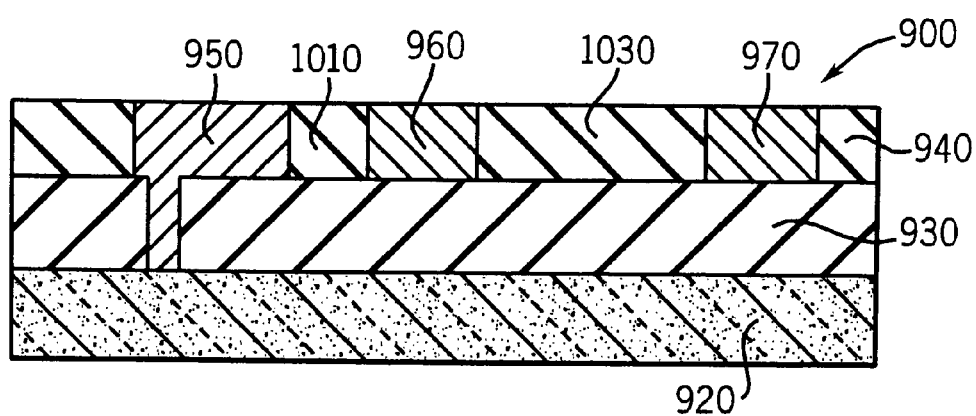
FIG. 17 is a cross-sectional view of the portion of the IC of FIG. 13, showing a removal of the dielectric material step.

In FIG. 17, a portion of thick dielectric 1020 (FIG. 16) is removed leaving conductive layer 940 substantially planar with the conductive lines 950 and 960 of the formed interconnect capacitor exposed. Preferably, the portion of thick dielectric 1020 is removed by a chemical-mechanical polish (CMP). However, another method of removal which leaves conductive layer 940 substantially planar can be used.

As an example, using the method illustrated in FIGS. 13 through 17 and the previously discussed 0.25 um technology, an interconnect capacitance of 0.63 to 44 fF/um or 0.44 to 46 fF/um$^2$ can be achieved depending upon the chosen dielectric material. It should be recognized that these achievable capacitances are larger than gate capacitance (approximately 8 fF/um$^2$) where the k value of the chosen dielectric is greater than 50. In addition, capacitance can be increased by optimizing processes and reducing distance between interconnect lines.

Figure 18:
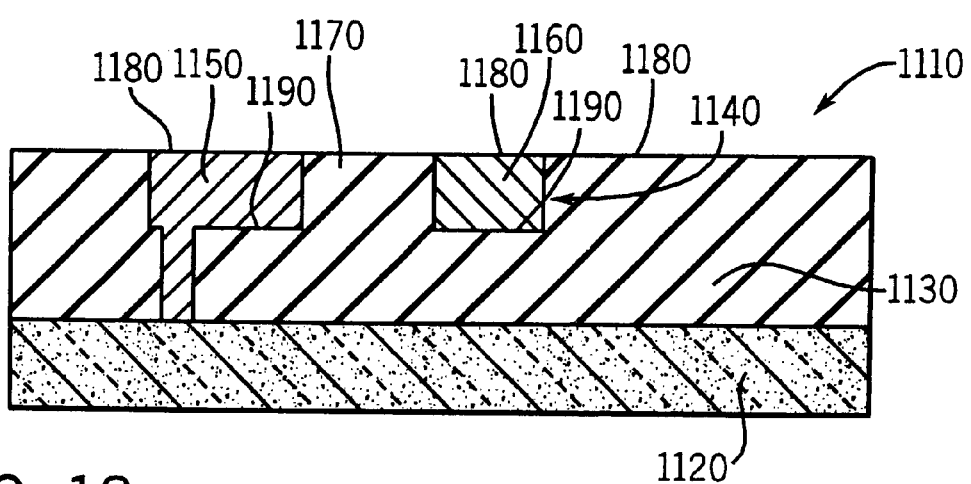
FIG. 18 is a cross-sectional view of a portion of an IC including two conductive lines separated by a dielectric material.

FIGS. 18 through 22 illustrate a method particularly suited for fabricating thin dielectric interconnect capacitors (thin capacitors) such as those shown in FIGS. 8–12. Advantageously, the method defines thin dielectric area of the thin capacitors by using a photo mask such that interconnect conductive lines are not affected by the thin dielectric. Referring to FIG. 18, a cross-sectional view of a portion 1110 of an integrated circuit (IC) is illustrated. Portion 1110 includes a substrate 1120, an inter-level dielectric 1130 disposed over the substrate 1120, and a conductive layer 1140 disposed over the inter-level dielectric 1130. Conductive layer 1140 comprises all material disposed between an intermediate level 1190 and the top level 1180 of the portion 1110. Particularly, conductive layer 1140 includes a conductive line 1150 and a conductive line 1160 separated by an area 1170. Preferably, inter-level dielectric 1130 is composed of a stack or composite including an etch stop (e.g., $Si_3N_4$), but can be composed of any dielectric known in the art. Area 1170 is preferably composed of a material distinct from the material that composes the inter-level dielectric 1130, but can be composed of any dielectric known in the art.

Figure 19:
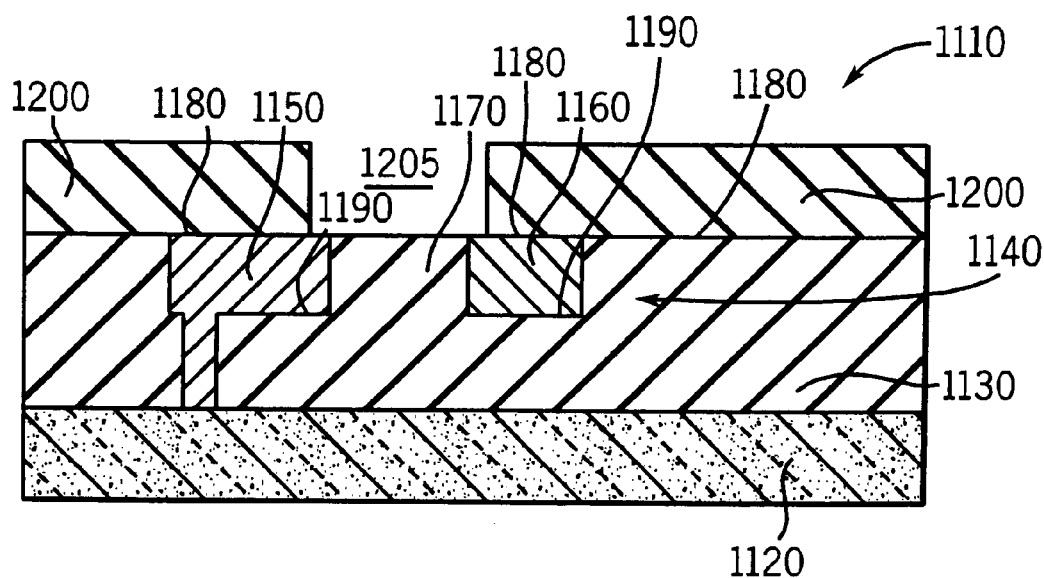
FIG. 19 is a cross-sectional view of the IC of FIG. 18 showing a lithographic patterning step.

After providing portion 1110 as illustrated in FIG. 18, a photolithographic technique is used to provide a pattern over conductive layer 1140 of portion 1110. Referring now to FIG. 19, the pattern includes a photo-resist 1200 and an open etch window 1205. Photo-resist 1200 can be any photoresist. In addition, it should be noted that any technique for forming a pattern above the conductive layer 1140 can be used.

Having formed the pattern over conductive layer 1140, area 1170 of conductive layer 1140 is removed through open etch window 1205. Area 1170 can be removed by dry etching. However, it should be noted that any type of removal process (e.g., wet or dry etch) can be used to remove area 1170. The etch is stopped by using inter-level dielectric material 1130 as the etch stop.

After etching portion 1110 to remove area 1170, photo-resist 1200 is removed. Advantageously area 1170 is one minimum lithographic feature wide. Because lines 1150 and 1160 border area 1170, etch window 1205 does not have to be aligned perfectly. Preferably, the etch process for removing area 1170 does not remove lines 1150 and 1160.

Figure 20:
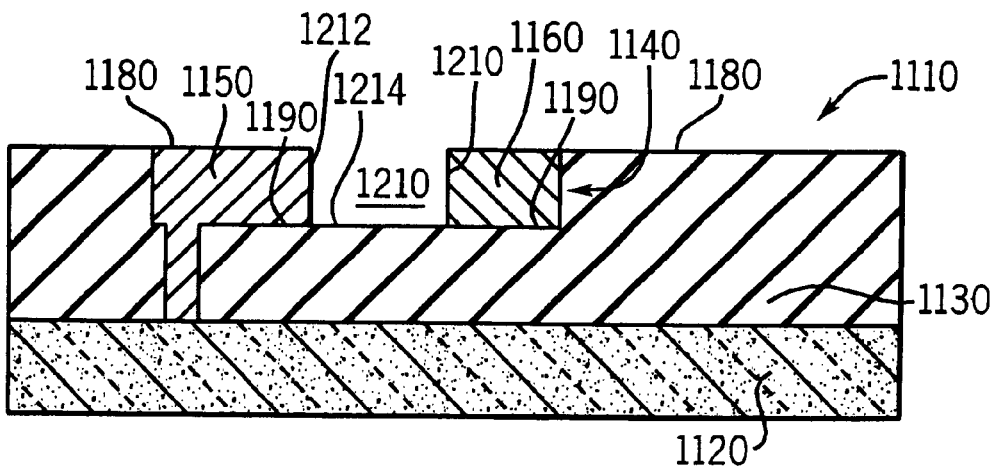
FIG. 20 is a cross-sectional view of the portion of the IC of FIG. 18 showing an aperture formation step.

FIG. 20 illustrates the portion 1110 after removal of area 1170 and photo-resist 1200. Referring now to FIG. 20, an aperture 1210 exists in conductive layer 1140 of the portion 1110. Aperture 1210 is defined by a right vertical surface 1216 of conductive line 1160, a left vertical surface 1212 of conductive line 1150, and an upper surface 1214 of dielectric layer 1130.

Figure 21:
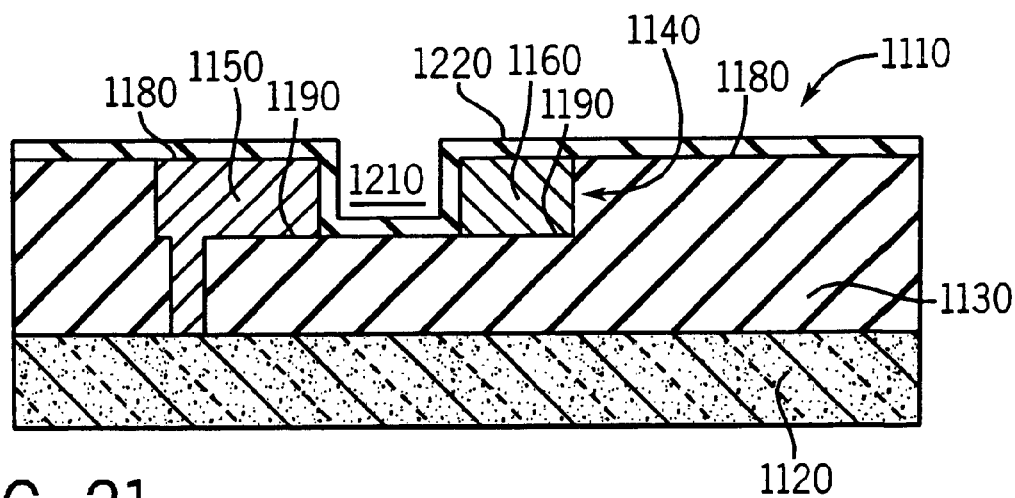
FIG. 21 is a cross-sectional view of the portion of the IC of FIG. 18, showing a thin dielectric material deposition step.

With aperture 1210 opened in portion 1110, as illustrated in FIG. 21, a thin dielectric material 1220 is formed over conductive layer 1140. Particularly, thin dielectric material 1220 covers right vertical surface 1216 of conductive line 1160, left vertical surface 1212 of conductive line 1150, and upper surface 1214 of dielectric layer 1130. Thin dielectric material 1220 is approximately 100 nm thick and can be composed of any dielectric, however, dielectric materials previously discussed are preferable. Thin dielectric material 1220 is formed over conductive layer 1140 by conformal deposition (e.g., CVD), however, any method of forming thin dielectric material 1220 over conductive layer 1140 can be used.

Figure 22:
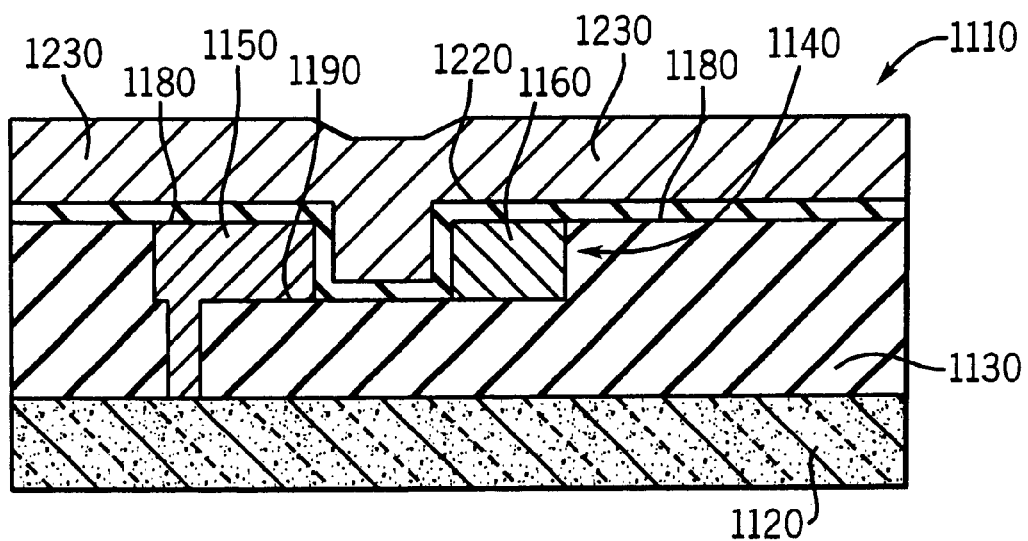
FIG. 22 is a cross-sectional view of the portion of the IC of FIG. 18 showing a conductive material deposition step.

Referring now to FIG. 22, a conductive material 1230 is formed over thin dielectric material 1220. Conductive material 1230 includes various conductive materials, such as, refractory metals or other conductive matter (e.g., Aluminum (Al), Copper (Cu), Titanium (Ti)). It should be noted, however, that any conductive material and/or method of forming conductive materials can be used to form conductive material 1230 over thin dielectric material 1220.

After forming the conductive layer, a chemical-mechanical polish is applied to portion 1110. The chemical-mechanical polish removes portions of both thin dielectric 1220 and conductive material 1230 existing above the top level 1180 of the portion 1110. Previously described FIG. 7 illustrates the portion 1110 after removal of portions of thin dielectric 1220 and conductive material 1230. As illustrated, the portion 1110 includes a first and a second thin capacitor. The first thin capacitor includes: (1) conductive line 1150 coupled to a first signal, (2) a conductive line 540 coupled to a capacitance signal, and (3) an intervening dielectric material 560 separating conductive lines 1150 and 540. The second thin capacitor includes: (1) conductive line 1160 coupled to a second signal, (2) conductive line 540 coupled to a capacitance signal, and (3) intervening dielectric material 560 separating and conductive lines 1160 and 540. Thus, thin capacitors are realized on a single conductive level 1140.

FIGS. 23 through 31 illustrate yet another method of fabricating interconnect capacitors on a single level of an IC. The method includes using a damascene process to form conductive lines of an interconnect capacitor. In addition, the method uses a high k dielectric material placed between neighboring interconnect lines at the same level to realize the interconnect capacitor. Advantageously, the method defines a thin dielectric area of the interconnect capacitors by using a photo mask such that interconnect conductive lines are not affected by the thin dielectric.

In general, damascene processing is a fabrication technique that involves the creation of interconnect lines by first etching a trench in a planar dielectric layer, and then filling that trench with a conductive material. The method is capable of introducing copper metal, which is not easily etched into the semiconductor device. Therefore, damascene processing is desirable for fabricating sub-quarter micron interconnects.

Figure 23:
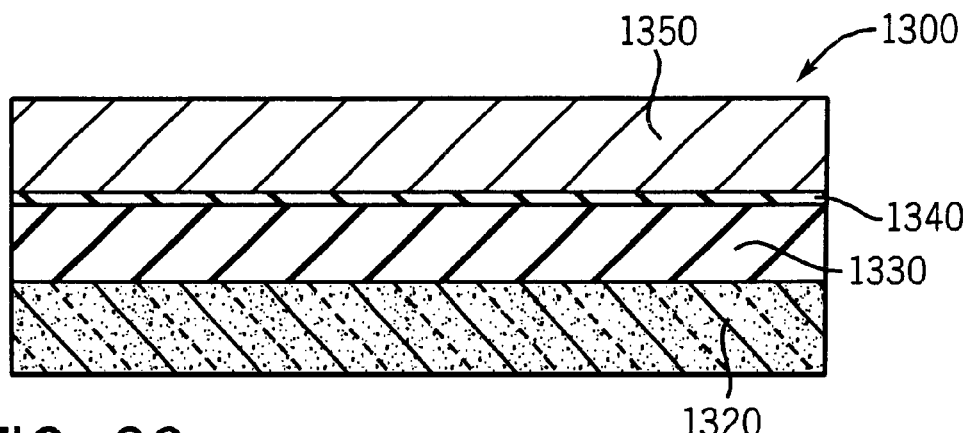
FIG. 23 is a cross-sectional view of a portion of an IC including a dielectric layer over a substrate, an etch stop layer over the dielectric layer, a conductive layer over the etch stop layer, and a contact connecting the substrate to the conductive layer.

Referring to FIG. 23, a portion 1300 of an IC is illustrated. Portion 1300 includes a substrate 1320, a dielectric layer 1330 disposed over substrate 1320, an etch stop layer 1340 disposed over dielectric layer 1330, and a conductive layer 1350 disposed over etch stop layer 1340. Conductive layer 1350 at this point in the fabrication process is shown as a dielectric layer. However, conductive lines or patterns are later formed in this layer (See FIGS. 26 and 27) so it is convenient to refer to this layer as a conductive layer which is understood as including a conductive wiring pattern, as well as, non-conductive dielectric portions. In addition, portion 1300 contains a contact 1360. Contact 1360 extends from substrate 1320 to layer 1350.

Figure 24:
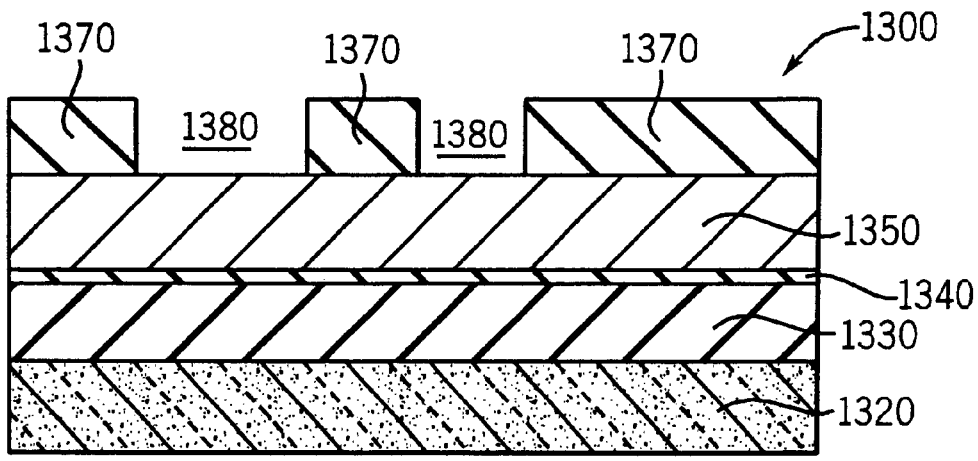
FIG. 24 is a cross-sectional view of the portion of the IC of FIG. 23, showing a lithographic patterning step.

Turning to FIG. 24, a photolithographic technique is used to provide a pattern over conductive layer 1350 of portion 1300. The pattern includes a photo-resist area 1370 and open etch windows 1380. Preferably, photo-resist 1370 can be any photo-resist. In addition, it should be noted that any technique for forming a pattern above conductive layer 1350 can be used.

Figure 25:
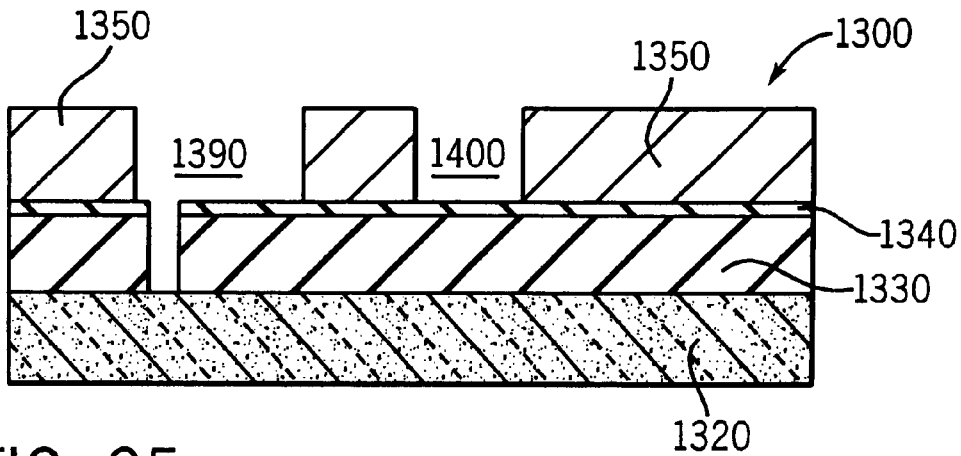
FIG. 25 is a cross-sectional view of the portion of the IC of FIG. 23 showing an aperture formation step.

Having formed the pattern over conductive layer 1350, a portion of conductive layer 1350 located below open etch windows 1380 is removed. Removal is accomplished by a dry or wet etch process. However, it should be noted that any type of wet or dry etch can be used to remove the portion of conductive layer 1350. The etch is stopped by etch stop layer 1340. After etching portion 1350, photo-resist 1370 is removed. FIG. 25 illustrates portion 1300 after removal of portions of conductive layer 1350 and photo-resist 1370. Referring now to FIG. 25, a first aperture 1390 and a second aperture 1400 exist in conductive layer 1350 of portion 1300.

Figure 26:
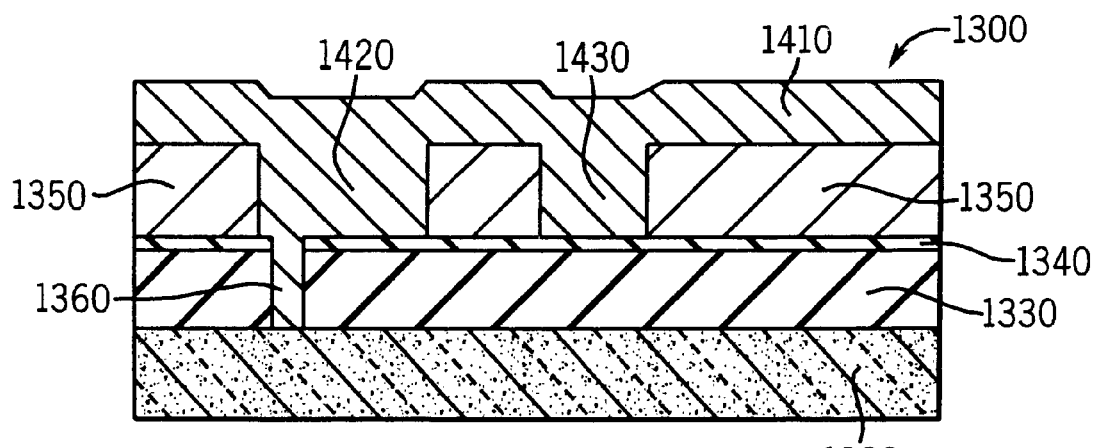
FIG. 26 is a cross-sectional view of the portion of the IC of FIG. 23 showing a conductive material deposition step.

Next, referring to FIG. 26, a conductive material 1410 is formed over portion 1300. Preferably, conductive material 1410 is formed by a plating technique. Apertures 1390 and 1400 are filled with conductive material 1410. A conductive line 1420 is formed where conductive material 1410 fills aperture 1390. A conductive line 1430 is formed where conductive material 1410 fills aperture 1400.

Figure 27:
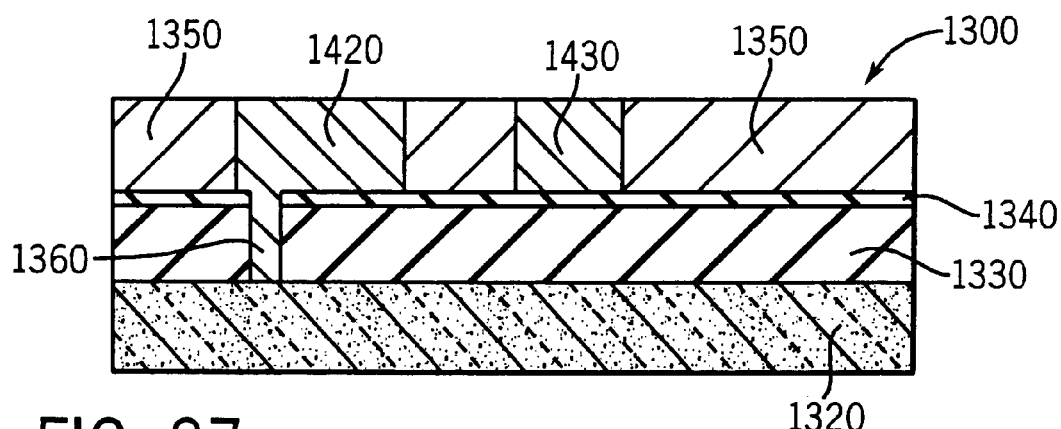
FIG. 27 is a cross-sectional view of the portion of the IC of FIG. 23 showing a selective conductive material removal step.

Having formed conductive lines 1420 and 1430, a chemical-mechanical polish is performed to remove a portion of conductive material 1410 above conductive layer 1350. FIG. 27 illustrates the portion 1300 including conductive lines 1420 and 1430 after performance of the chemical-mechanical polish.

Figure 28:
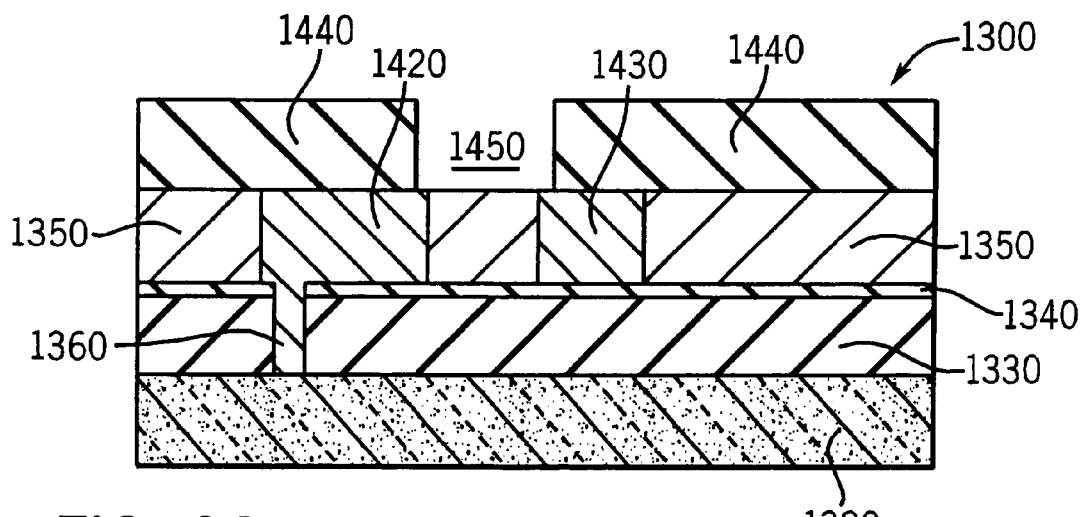
FIG. 28 is a cross-sectional view of the portion of the IC of FIG. 23 showing a lithographic patterning step over the conductive layer.

With conductive lines 1420 and 1430 formed in conductive layer 1350, a photolithography technique is used to provide a pattern over conductive layer 1350. Referring now to FIG. 28, the pattern includes a photo-resist area 1440 and an open etch window 1450.

Figure 29:
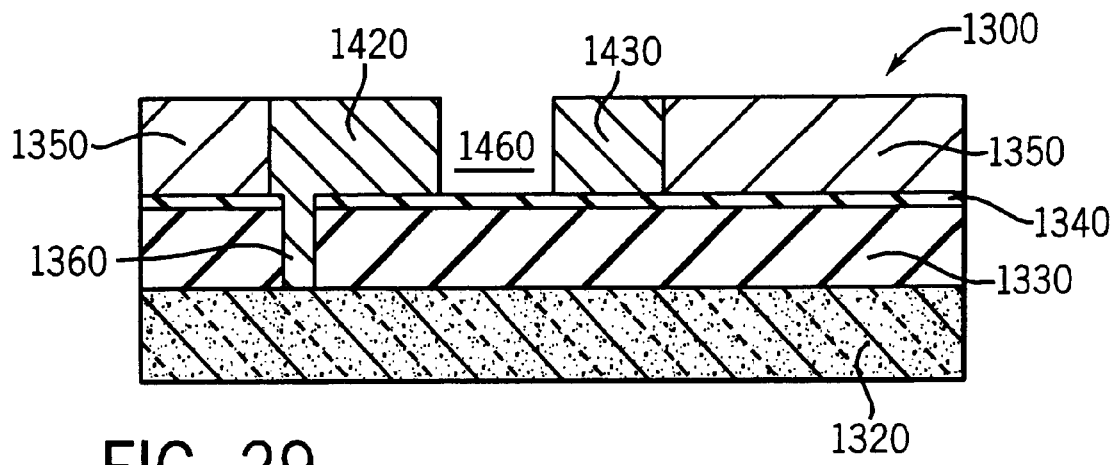
FIG. 29 is a cross-sectional view of the portion of the IC of FIG. 23 showing a selective removal the conductive layer step.

Having formed the pattern over conductive layer 1350, a portion of conductive layer 1360 below open etch window 1450 is removed. The portion of conductive layer 1350 below open etch window 1450 can be removed dry or wet etching technique. However, it should be noted that any type of wet or dry etch can be used for removal. The etch is stopped by using the etch stop barrier 1340 (an inter-level dielectric barrier layer) as the etch stop. After etching portion 1300 to remove the portion of conductive layer 1350 below open etch window 1450, photo-resist 1440 is removed. FIG. 29 illustrates portion 1300 after removal of the photo-resist 1440. Referring now to FIG. 29, an aperture 1460 exists in conductive layer 1350 of portion 1300.

Figure 30:
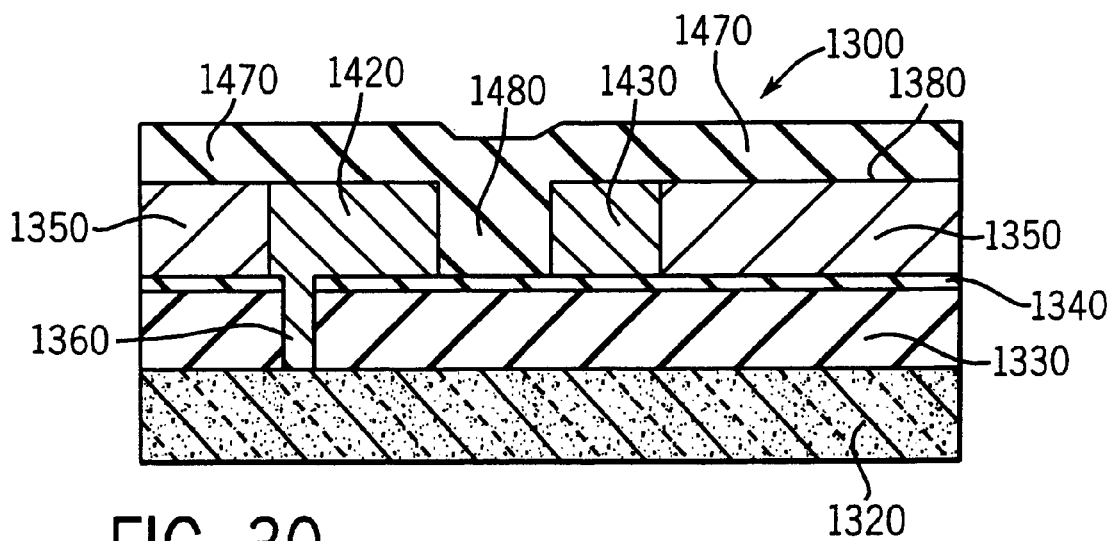
FIG. 30 is a cross-sectional view of the portion of the IC of FIG. 23 showing a dielectric material deposition step.

Referring now to FIG. 30, with aperture 1460 (FIG. 29) opened in portion 1300, a dielectric 1470 is formed over conductive layer 1350. Dielectric 1470 fills aperture 1460 of FIG. 29. Filled aperture 1480, forms the dielectric for an interconnect capacitor. Dielectric material 1470 can be composed of any dielectric, however, dielectrics previously discussed are preferable. Most preferably, dielectric material 1470 has a higher dielectric constant than other non-conductive dielectric portions of layer 1350. Dielectric material 1470 is formed over conductive layer 1350 by deposition, however, any method of forming dielectric 1470 over conductive layer 1350 can be used.

Figure 31:
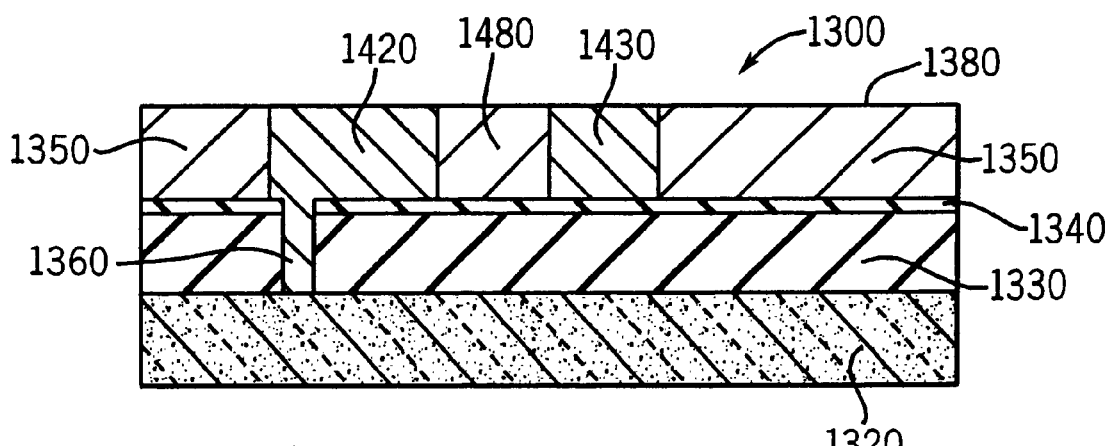
FIG. 31 is a cross-sectional view of the portion of the IC of FIG. 23 showing a planarization of the dielectric step.

Referring to FIG. 31, a chemical-mechanical polish is applied to portion 1300. The chemical-mechanical polish removes portions of dielectric material 1470 existing above top level 1380 of the portion 1300. Conductive lines 1420 and 1430 act as a chemical-mechanical stop. After completion of fabrication, portion 1300 contains an interconnect Capacitor on a single level of the IC. The interconnect capacitor is comprised of conductive lines 1420 and 1430 separated by dielectric 1480.

Of note, the present invention provides the following advantages over existing capacitor technologies:

(1) Reliability. Using existing technologies, interconnect capacitors have a minimum dielectric thickness of 400 to 800 nm verses conventional gate oxide capacitance with dielectric thickness between 3 and 5 nm. The greater dielectric thickness results in higher reliability and less leakage.

(2) Higher Yield. The present invention allows reduced die size by avoiding use of large area gate capacitors and related control circuits and fuses. Reducing die size both increases yield and minimizes the concern of loading effect in the process.

(3) Smaller Parasitic Resistance. Only conductive (typically metal) related resistances are involved which improves frequency response.

(4) Constant Capacitance. The capacitance of an interconnect capacitor is not a function of bias making it useful for a wider range of applications.

(5) Flexibility. An interconnect capacitor is created in a single conductive layer which has no impact on other layers of the design. Additionally, an interconnect capacitor can be created in any conductive layer.

(6) Compatibility and Efficiency. As shown in FIGS. 2, 4–6, 8, and 10–12, interconnect capacitors may be formed within very small areas apart from or adjoining signal lines.

(7) Non-Exclusive. Interconnect capacitors may be used along with other capacitor technologies to form desirable capacitor circuitry. Thus, interconnect capacitors represent a valuable building block to an IC designer to aid in optimizing IC performance, yield, reliability, and size.

It is understood that while the detailed drawings, specific examples, and particular values given provide preferred exemplary and alternative embodiments of the present invention, it is for the purpose of illustration only. The apparatus of the invention is not limited to the precise details and conditions disclosed. Various changes may be made to the details disclosed without departing from the spirit of the invention which is defined by the following claims.

What is claimed is:

1. An integrated circuit comprising a substrate, a dielectric layer disposed over the substrate, and a conductive layer disposed over the dielectric layer, wherein the conductive layer includes:

a first line disposed adjacent to a second line, the first line being separated from the second line by a first spacing;

a high k dielectric material disposed in the first spacing between the first line and the second line;

a third line separated from the first line by a second spacing, the second spacing being larger than the first spacing; and a first dielectric material disposed in the second spacing, the first dielectric material having a lower dielectric constant than the high k dielectric material, wherein the first line is coupled to receive a first signal and the second line being coupled to receive a capacitor signal, whereby a capacitor is formed between the first line and the second line separated by the high k dielectric material.

2. The integrated circuit of claim 1, wherein the integrated circuit includes a plurality of metal layers and the conductive layer is one of the metal layers.

3. The integrated circuit of claim 1, wherein the thickness of the high k dielectrical material is at least as thick as the width of the first spacing.

4. The integrated circuit of claim 3, wherein the capacitor has a capacitance of about 0.50 fF per micrometer and wherein the high k dielectric material is less than 0.59 microns thick.

5. The integrated circuit of claim 1, wherein the high k dielectric material includes one or more of the following materials: amorphous or crystalline $Ta_2O_5$, and anatase, amorphous, or crystalline $TiO_2Al_2O_3$, $Si_3N_4$, BST, and PZT.

6. The integrated circuit of claim 1, wherein the second line is coupled directly to the substrate.

7. The integrated circuit of claim 6, wherein the first dielectric material is a low k material.

8. The integrated circuit of claim 2, wherein the first line includes a plurality of first fingers and the second line includes a plurality of second fingers, the first fingers being interstitially disposed with the second fingers.

9. The integrated circuit of claim 1, wherein the conductive layer further comprises:

a fourth line and a fifth line disposed such that the fourth line is between the third line and the fifth line;

the fourth line being coupled to the first signal;

the fifth line being coupled to the capacitor signal; and the high k dielectric material disposed between the fourth line and the fifth line.

10. A metal layer for an integrated circuit comprising:

a first conductive line coupled to a first signal;

a second conductive line coupled to a capacitor signal;

a third conductive line coupled to a second signal; and wherein a high k dielectric material separates the first conductive line from the second conductive line, and a first dielectric material separates the third conductive line and the second conductive line, the first dielectric material having a lower dielectric constant than the high k dielectric material, wherein the first conductive line and the second conductive line are separated by the high k dielectric material to form a capacitor within the metal layer.

11. The metal layer of claim 10, where the high k dielectric material includes one or more of the following materials: amorphous or crystalline $Ta_2O_5$, and anatase, amorphous, or crystalline $TiO_2$, $Al_2O_3$, $Si_3N_4$, BST, and PZT the first conductive line includes a plurality of first fingers and the second conductive line includes a plurality of second fingers, the first fingers being interstitially disposed with the second fingers.

12. The metal layer of claim 10, wherein the high k gate dielectric material is at least as thick as the distance between the first conductive line and the second conductive line.

13. An integrated circuit comprising a substrate, a dielectric layer disposed over the substrate, and a conductive layer disposed over the dielectric layer, wherein the conductive layer includes:

a first signal line disposed within a first distance from a capacitor signal line;

a high k dielectric material disposed between the first signal line and the capacitor signal line;

a second signal line disposed within a second distance from the capacitor signal line;

a non-high k dielectric material disposed between the capacitor signal line and the second signal line; and the first signal line being coupled to receive a first signal and the capacitor signal line being coupled to receive a capacitor signal, whereby a capacitor is formed between the first signal line and the capacitor signal line separated by the high k dielectric material, wherein the first distance is less than the second distance.

14. The integrated circuit of claim 13, wherein the first distance is one minimum lithographic feature.

15. The integrated circuit of claim 13, wherein the second distance is at least twice as large as the first distance.

16. The integrated circuit of claim 13, wherein the high k dielectric includes one or more of the following materials: amorphous or crystalline $Ta_2O_5$, and anatase, amorphous, or crystalline $TiO_2Al_2O_3$, $Si_3N_4$, BST, and PZT.

17. The integrated circuit of claim 13, wherein the conductive layer further comprises:

a third signal line disposed adjacent to the first signal line, the first signal line being between the third signal line and the capacitor signal line;

the high k dielectric material disposed between the third signal line and the first signal line;

the third signal line being coupled to the capacitor signal;

a fourth signal line and a fifth signal line disposed such that the fourth signal line is between the third signal line and the fifth signal line, the fourth signal line being coupled to the first signal;

the fifth signal line being coupled to the capacitor signal;

the high k dielectric material disposed between the third signal line and the fourth signal line; and the high k dielectric material disposed between the fourth signal line and the fifth signal line.

18. The integrated circuit of claim 13, wherein the capacitor comprises an interconnect capacitor.

19. The integrated circuit of claim 13, wherein the high k dielectric material is less than 0.59 microns thick.

* * * * *